(12) United States Patent
Erhart

(10) Patent No.: US 11,280,852 B2
(45) Date of Patent: Mar. 22, 2022

(54) BATTERY MANAGEMENT UNIT WITH A PCB INTEGRATED FLUXGATE CURRENT SENSOR

(71) Applicant: Samsung SDI Co., Ltd., Yongin-si (KR)

(72) Inventor: Michael Erhart, Seiersberg (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 99 days.

(21) Appl. No.: 16/742,003

(22) Filed: Jan. 14, 2020

(65) Prior Publication Data
US 2020/0264245 A1 Aug. 20, 2020

(30) Foreign Application Priority Data

Feb. 20, 2019 (EP) ..................................... 19158291

(51) Int. Cl.
G01R 33/04 (2006.01)
G01R 15/18 (2006.01)
(Continued)

(52) U.S. Cl.
CPC ........... G01R 33/04 (2013.01); G01R 15/185 (2013.01); G01R 15/202 (2013.01);
(Continued)

(58) Field of Classification Search
CPC ...... G01R 33/04; G01R 33/05; G01R 15/185; G01R 15/207; G01R 33/02; G01R 15/202;
(Continued)

(56) References Cited

U.S. PATENT DOCUMENTS 9,410,985 B2 8/2016 Klein
2004/0027121 A1 2/2004 Choi et al.
(Continued)

FOREIGN PATENT DOCUMENTS

EP 1 387 179 A2 2/2004
EP 1 450 176 A1 8/2004
(Continued)

OTHER PUBLICATIONS

Extended European Search Report issued in EP19158291.5, dated Sep. 4, 2019, 10 pages.
(Continued)

*Primary Examiner* — Raul J Rios Russo
(74) *Attorney, Agent, or Firm* — Lewis Roca Rothgerber Christie LLP

(57) ABSTRACT

A battery management unit for a battery system with a conductor or a busbar, the battery management unit including a printed circuit board, and a fluxgate current sensor including a magnetic core having a through-hole, at least one excitation winding, at least one compensation winding, and a sensor circuit configured to measure a magnetization of the at least one excitation winding, to generate a driving signal for driving the at least one compensation winding, to generate a current flowing through the at least one compensation winding according to the driving signal, and to generate an output signal corresponding to a magnitude of an electric current flowing through the through-hole of the magnetic core, wherein the magnetic core, the at least one excitation winding, the at least one compensation winding, and the sensor circuit are each integrated into the printed circuit board.

14 Claims, 11 Drawing Sheets

(51) Int. Cl.
*H02J 7/00* (2006.01)
*G01R 15/20* (2006.01)
*G01R 33/02* (2006.01)
*G01R 33/00* (2006.01)

(52) U.S. Cl.
CPC ........... *G01R 15/207* (2013.01); *G01R 33/02* (2013.01); *H02J 7/0014* (2013.01); *G01R 33/0041* (2013.01); *G01R 33/045* (2013.01)

(58) Field of Classification Search
CPC .. G01R 33/0041; G01R 33/045; H02J 7/0014
USPC .... 324/51, 55, 200, 227, 228, 236, 244, 253
See application file for complete search history.

(56) References Cited

U.S. PATENT DOCUMENTS

| | | | |
|---|---|---|---|
| 2004/0124836 A1* | 7/2004 | Kang | G01R 33/045 324/253 |
| 2006/0158176 A1 | 7/2006 | Preusse et al. | |
| 2013/0057267 A1 | 3/2013 | Klein | |
| 2016/0202294 A1* | 7/2016 | Snoeij | G01R 15/20 324/127 |
| 2017/0115328 A1* | 4/2017 | Seki | G01R 19/0092 |
| 2021/0141002 A1* | 5/2021 | Chetanneau | G01R 19/0092 |

FOREIGN PATENT DOCUMENTS

| | | |
|---|---|---|
| GB | 2 432 008 A | 5/2007 |
| WO | WO 2005/005998 A1 | 1/2005 |

OTHER PUBLICATIONS

Azzoni, Davide, et al., "Battery monitoring current sensors: the fluxgate concept", 13th European Conference on Power Electronics snd Applications, 2009: EPE 09; Sep. 8-10, 2009, Barcelona, Spain, IEEE, Piscataway, NJ, USA, Sep. 8, 2009 (Sep. 8, 2009), 10 pages, XP031541509, ISBN: 978-1-4244-4432-8.

O'Donnell, Terence, et al., "Planar fluxgate current sensor integrated in printed circuit board", Sensors and Actuators A: Physical, Elsevier BV, NL, vol. 129, No. 1-2, May 24, 2006, pp. 20-24, XP027935520, ISSN: 0924-4247 [retrieved on May 24, 2006].

* cited by examiner

BATTERY MANAGEMENT UNIT WITH A PCB INTEGRATED FLUXGATE CURRENT SENSOR

CROSS-REFERENCE TO RELATED APPLICATION

This application claims priority to and the benefit of European Patent Application No. 19158291.5, filed in the European Patent Office on Feb. 20, 2019, the entire content of which is incorporated herein by reference.

BACKGROUND

1. Field of the Invention

Aspects of the present invention relate to a battery management unit (BMU) and a battery system employing the BMU.

2. Description of the Related Art

A rechargeable or secondary battery differs from a primary battery in that it can be repeatedly charged and discharged, while the latter provides only an irreversible conversion of chemical to electrical energy. Low-capacity rechargeable batteries are used as power supplies for small electronic devices, such as cellular phones, notebook computers, and camcorders, while high-capacity rechargeable batteries are used as power supplies for hybrid vehicles and the like.

In general, rechargeable batteries include an electrode assembly including a positive electrode, a negative electrode, and a separator interposed between the positive and negative electrodes, a case receiving the electrode assembly, and an electrode terminal electrically connected to the electrode assembly. An electrolyte solution is injected into the case to enable charging and discharging of the battery via an electrochemical reaction of the positive electrode, the negative electrode, and the electrolyte solution. The shape of the case, which may, for example, be cylindrical or rectangular, depends on the battery's intended purpose.

A rechargeable battery may be a battery module formed of multiple battery submodules, each including battery cells coupled in series and/or in parallel so as to provide a high energy density, for example, for a hybrid vehicle. Such battery modules may be mechanically and electrically integrated, equipped with a thermal management system, and set up for communication with each other and one or more electrical consumers to form a battery system.

For meeting the dynamic power demands of various electrical consumers connected to the battery system, a static control of battery power output and charging is not sufficient. Thus, it is desired to have steady or intermittent exchange of information between the battery system and the controllers of the electrical consumers. This information includes the battery system's actual state of charge (SoC), potential electrical performance data including the actual electrical current supplied by the battery system, charging ability, and internal resistance, as well as actual or predicted power demands or surpluses of the consumers.

For monitoring, controlling, and/or setting of the aforementioned parameters, a battery system usually includes a battery management unit (BMU), a battery management system (BMS), and/or an electronic control unit (ECU). For ease of description, the acronym BMU shall refer to any one of a BMU, a BMS, or an ECU throughout the following. A battery system may also employ several BMU's such as a main BMU and one or more ancillary BMU's. Such control units may be an integral part of the battery system and disposed within a common housing or may be part of a remote control unit communicating with the battery system via a suitable communication bus. In both cases, the control unit may communicate with the electrical consumers via a suitable communication bus, for example, a controller area network (CAN) or a serial peripheral interface (SPI) interface.

For controlling the actual electric current supplied by the battery system, a fluxgate current sensor may be employed. According to the state of the art, the fluxgate current sensor is designed separately from the PCB of the battery system's BMU. In particular, the fluxgate current sensor includes a magnetic core and windings, both being separated from the PCB. The fluxgate current sensor is integrated in a plastic housing and is connected via a wiring harness and according to special protocols to the (main or ancillary) BMU of a battery system.

In other words, in addition to the BMU component, further components such as a wiring harness and connectors are used, which produce additional costs with respect to both materials and manufacturing, in particular, when the mounting process of the fluxgate sensor and its connection to the BMU are performed manually. Thus, employing a fluxgate current sensor in connection with a BMU or in a battery system is time-consuming and cost-intensive.

Therefore, what is desired is a current sensor, and in particular, a fluxgate current sensor, that allows for less material requirements for its production and an improved/easier implementation into the battery system.

It is thus an aspect of the present invention to overcome or reduce the above-identified drawbacks of the related art and to provide a current sensor to be employed by a BMU that can be produced at lower cost and within a shorter time as compared to the related art. It is a further aspect of the invention to provide a BMU equipped with said current sensor. Moreover, it is an aspect of the invention to provide a battery system that includes the BMU equipped with the current sensor according to the invention. It is a further aspect of the present invention to provide a method of implementing the BMU equipped with said current sensor into a battery system.

DESCRIPTION OF THE INVENTION

One or more of the drawbacks of the related art could be avoided or at least reduced by embodiments of the present invention as disclosed herein. An aspect of the present invention is to provide a concept allowing for highly integrating a current sensor such as a fluxgate current sensor on the BMU of a battery system.

According to some embodiments of the present invention, there is provided a battery management unit for a battery system with a conductor or a busbar, the battery management unit including: a printed circuit board; and a fluxgate current sensor including: a magnetic core having a through-hole; at least one excitation winding wound around the magnetic core; at least one compensation winding wound around the magnetic core; and a sensor circuit configured to measure a magnetization of the at least one excitation winding, to generate a driving signal for driving the at least one compensation winding such that a magnetic flux in the magnetic core is cancelled out by a current in the at least one compensation winding, to generate a current flowing through the at least one compensation winding according to the driving signal, and to generate an output signal corresponding to a magnitude of an electric current flowing through the through-hole of the magnetic core; wherein the magnetic core, the at least one excitation winding, the at least one compensation winding, and the sensor circuit are each integrated into the printed circuit board, and wherein the magnetic core is arranged on the printed circuit board such that the battery management unit is mountable into the battery system and such that the conductor or the busbar of the battery system passes through the through-hole of the magnetic core.

In some embodiments, each of the excitation and compensation windings includes a plurality of turns, each of the turns extending in parallel with the printed circuit board around a virtual center axis perpendicular to the printed circuit board.

In some embodiments, the printed circuit board includes a plurality of layers, wherein the layers extend in stacked planes parallel to each other, wherein, for each one of the windings, at most one turn extends per layer, and wherein, for each winding of the windings, any two consecutive turns are connected to each other such that an entirety of the turns forms the winding.

In some embodiments, for each winding of the windings, the turns of the winding are arranged at one layer of the printed circuit board to form a flat spiral.

In some embodiments, the printed circuit board includes a plurality of layers, wherein the layers extend in stacked planes parallel to each other, wherein each one of the windings includes flat spiral windings arranged at all or a subset of the layers, and wherein, for each one of the windings, any two neighboring flat spiral windings are connected to each other such that an entirety of the turns forms one winding.

In some embodiments, the magnetic core is, apart from the through-hole, shaped as a cuboid.

In some embodiments, the through-hole has a rectangular cross-sectional shape, a polygonal cross-sectional shape, an elliptical cross-sectional shape, or a circular cross-sectional shape.

In some embodiments, the magnetic core passes through holes in the printed circuit board.

In some embodiments, a number of holes in the printed circuit board is two, and the magnetic core includes two U-shaped parts being shaped to pass through the holes in the printed circuit board.

In some embodiments, the two U-shaped parts of the magnetic core are configured to be held together by one or more spring brackets, by an adhesive, or by a housing of the battery management unit.

In some embodiments, the printed circuit board includes two neighboring layers, the magnetic core is flat and located between the two neighboring layers, each of the layers of the printed circuit board has a through-hole, the through-hole of the magnetic core and the through-holes of the layers are located to accommodate a conductor or a busbar passing through any one of said through-holes along a virtual center axis perpendicular to the printed circuit board, and, for each one of the windings, one half of each complete turn is arranged at one of the two layers and an other half of each complete turn is arranged on an other of the two layers.

In some embodiments, the magnetic core has a rectangular shape, a square shape, an elliptical shape, or a circular shape.

In some embodiments, each of the through-hole in the magnetic core and the through-holes in the layers of the printed circuit board has a rectangular shape, a square shape, an elliptical shape, or a circular shape.

According to some embodiments of the present invention, there is provided a battery system including the battery management unit described above; and a conductor, wherein the conductor is passed through the through-hole of the magnetic core.

BRIEF DESCRIPTION OF THE DRAWINGS

Features will become apparent to those of ordinary skill in the art by the description herein of exemplary embodiments with reference to the attached drawings in which.

DETAILED DESCRIPTION

Figure 1:
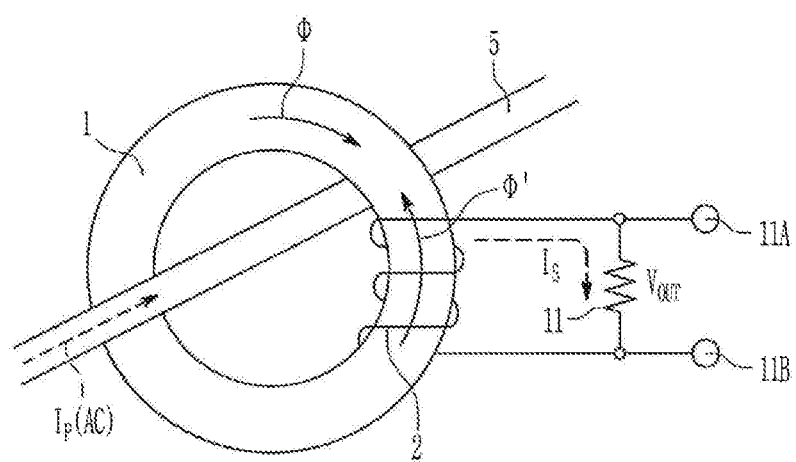
FIG. 1 schematically shows an open-loop current sensor including one winding and capable of measuring alternating currents (AC)

Reference will now be made in detail to embodiments, examples of which are illustrated in the accompanying drawings. Effects and features of the exemplary embodiments, and implementation methods thereof will be described with reference to the accompanying drawings. In the drawings, like reference numerals denote like elements, and redundant descriptions are omitted. The present invention, however, may be embodied in various different forms, and should not be construed as being limited to the illustrated embodiments. Accordingly, processes, elements, and techniques that are not considered necessary to those having ordinary skill in the art for a complete understanding of the aspects and features of the present invention may not be described. Further, in the drawings, the relative sizes of elements, layers, and regions may be exaggerated for clarity.

Current Sensors

Current sensors can be constructed based on magnetic sensors, exploiting the fact that a moving electric charge generates (e.g., induces) a magnetic field. Magnetic sensors are used in a broad range of applications such as position, alternating current (AC) and direct current (DC), and torque measurement. Hall-effect sensors are most common in magnetic field sensing, but their offset voltage, noise, gain variation, and non-linearity limit the achievable resolution and accuracy of the system. Fluxgate magnetic sensors offer significantly higher sensitivity, lower drift, lower noise, and high linearity and enable up to 1000-times better accuracy of the measurement.

For that reason, the present invention deploys a fluxgate current sensor. Hereinafter, the basic principles of the operating mode of a current sensor will be described with reference to FIGS. 1 to 5. A current $I_P$ to be measured flows through a conductor 5. The conductor 5 may be, for example, a busbar 110 of a battery system. The current $I_P$ flowing through the conductor 5 produces a magnetic field corresponding to the current. If, in the area of the measurement, the conductor 5 is assumed to be shaped as a straight line, the relation between the magnetic field H (more precisely: the magnetic field strength H) is given by $H=I_P/2\pi\times r$, with r denoting the distance from the conductor 5, in a region of homogeneous magnetic permeability.

The current sensor further includes a ring-shaped core 1 formed of a material having a high magnetic permeability such as iron or soft ferrites. Throughout the following, said core may also be referred to as "magnetic core." Further, in this context, the term "ring-shaped" shall refer not only to toroidal shapes, but to any shape topologically equivalent to a torus such as a cuboid, in particular a flat cuboid, having a single through-hole. The magnetic core 1 is arranged around the conductor 5 at an area, where the current $I_P$ shall be measured. Then, the magnetic field produced by the current $I_P$ causes a magnetic flux $\phi$ within the core 1, the magnetic flux $\phi$ being proportional to the magnetic field (lines) passing through the cross-section of the core 1.

In a simple realization of a current sensor depicted in FIG. 1, which may only work for measuring alternating currents (AC), said magnetic flux $\phi$ is detected by a secondary coil or secondary winding 2 (here, the "primary side" of the circuit is formed by the conductor 5). The change of the magnetic flux $\phi$ induces an (alternating) secondary current Is flowing to a shunt resistor 11, producing a voltage $V_{out}$ across its terminals 11A and 11B. This voltage is the measurement circuit's output, which is proportional to the current $I_P$ flowing in the conductor 5 being measured. A current sensor using such an arrangement is called an "open-loop current sensor," as it uses the voltage of the secondary current $I_S$ directly to produce its output signal. Such an arrangement is simpler to implement but can suffer from a certain amount of non-linearity.

Figure 2:
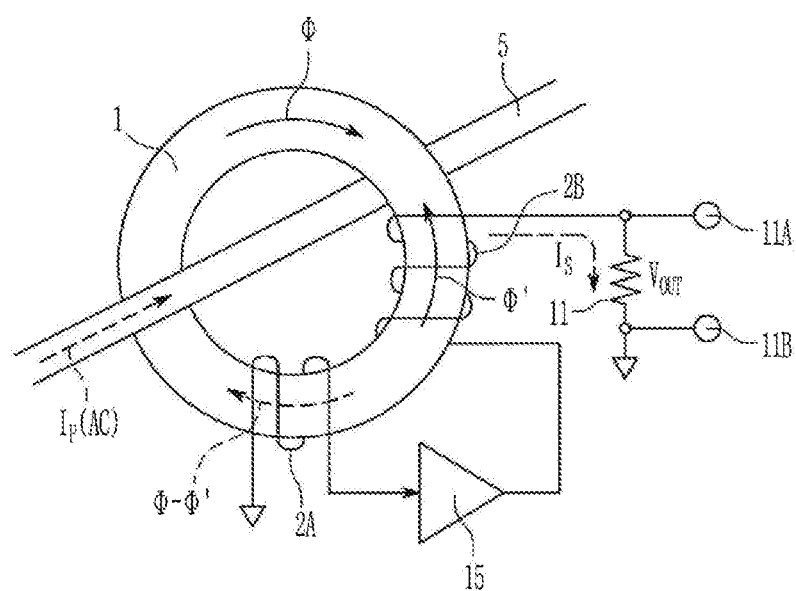
FIG. 2 schematically shows an AC zero-flux current sensor.

An "AC zero-flux current sensor" as depicted in FIG. 2 is typically realized as a "closed-loop sensor," that is, it has a winding 2B wound around the magnetic core 1, which may be a "compensation winding," a "compensation coil," or a "feedback winding", that is actively driven to produce a magnetic field that opposes the field produced by the current being sensed. This allows obtaining an output signal being proportional to the current driven into the compensation coil, which is in turn proportional to the current being measured. This method is more complex than the open-loop method, but it eliminates any non-linearities associated with the measurement of the magnetic flux $\phi$, because the measurement of the magnetic flux $\phi$ is performed at just a single point in its range, for example, around $\phi=0$.

To drive the compensation winding 2B as described above, the AC zero-flux current sensor has a further winding 2A, which may be referred to as a "detection winding," a "sense winding," or a "measurement winding" wound likewise around the core 1, that allows for measuring the magnetic flux $\phi$ in the core 1 via the current being induced in the detection winding 2A, the induced current being proportional to the magnetic flux $\phi$ in the core 1. This current is amplified, for example, by an operational amplifier 15, and then fed into the compensation winding 2B that generates a magnetic field H', which opposes the field H being generated by the current $I_P$ to be measured. In other words, the current in the compensation winding 2B produces, corresponding to the magnetic field H' in the region of the core 1, a magnetic flux $\phi'$ by which the flux $\phi$ is reduced, resulting in a total magnetic flux of $\phi-\phi'$ within the core 1. This flux is then measured by the detection winding 2A and again, after amplification, fed into the compensation winding 2B, thus forming a type of negative feedback operation such that the total magnetic flux within the core 1 becomes cancelled out.

As in the case of the current sensor of FIG. 1, the secondary current Is (i.e., the current flowing through the compensation winding 2B) flows to a shunt resistor 11, producing a voltage across its terminals 11A and 11B. This voltage is the measurement circuit's output, which is proportional to the current $I_P$ flowing in the conductor 5 being measured. Because the sensor operation depends on canceling out the magnetic flux in the core 1, AC zero-flux current sensors have excellent linearity and are not affected by the magnetic core's B-H characteristics (i.e., hysteresis). AC zero-flux sensors are well suited for use in power measurement because they are characterized by small phase error, even at low frequencies. AC zero-flux sensors have low insertion impedance because they are characterized by low operating magnetic flux levels.

Figure 3:
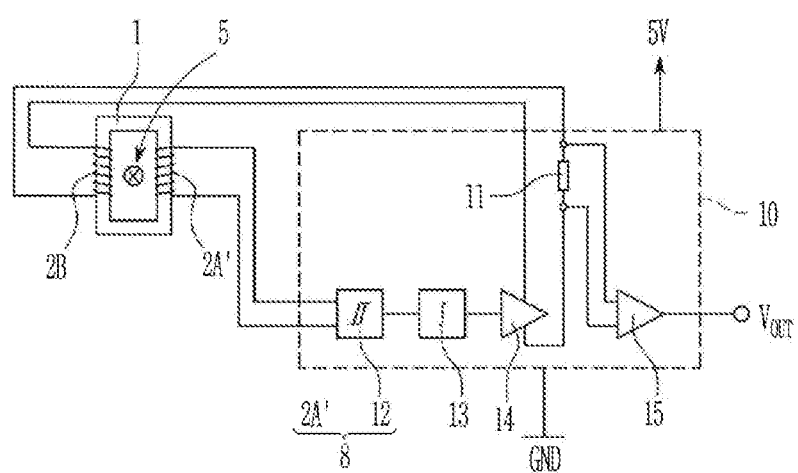
FIG. 3 schematically illustrates a fluxgate current sensor.
Figure 4A:
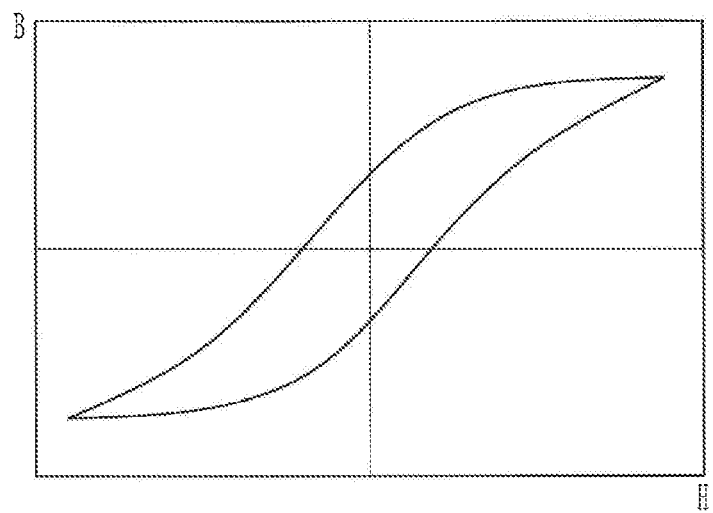
FIG. 4A shows a hysteresis (B-field vs. H-field of the magnetization) of the core of a fluxgate current sensor during a duty cycle in the absence of an external magnetic field.
Figure 4B:
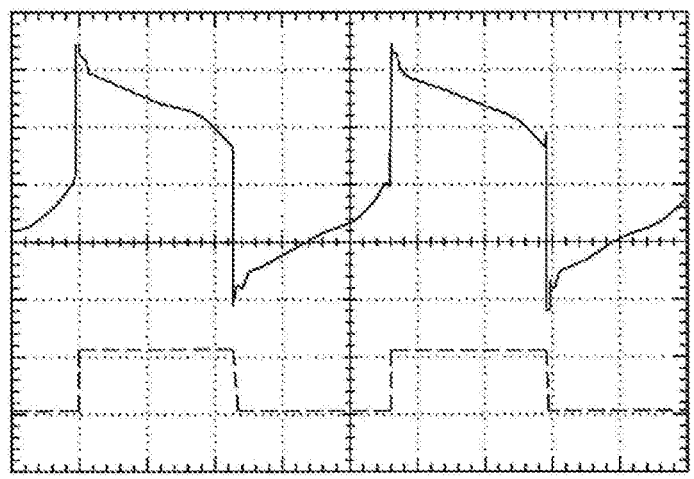
FIG. 4B shows the saturation (upper curve) and thus the direction of magnetization (lower curve) of the fluxgate current sensor during two duty cycles in the absence of an external magnetic field in arbitrary units.
Figure 5A:
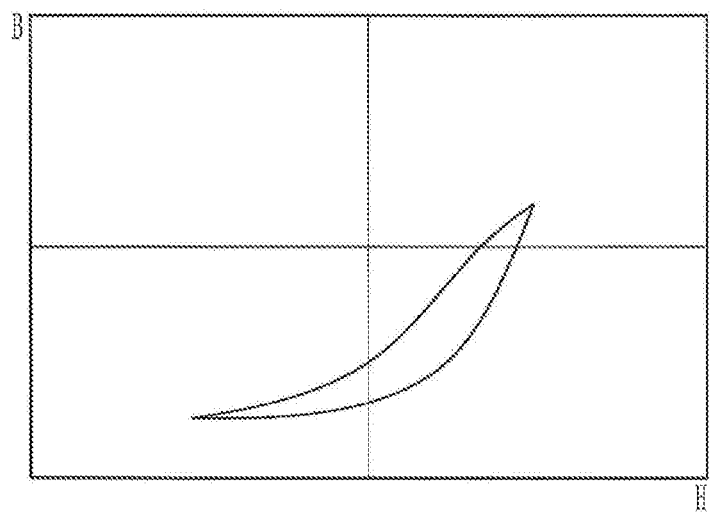
FIG. 5A shows the hysteresis (B-field vs. H-field of the magnetization) of the core of a fluxgate current sensor during a duty cycle in the presence of an external magnetic field.
Figure 5B:
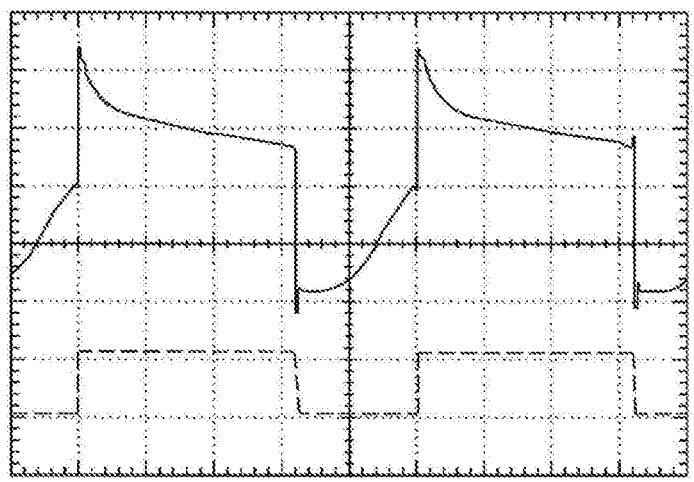
FIG. 5B shows the saturation (upper curve) and the direction of magnetization (lower curve) of the fluxgate current sensor during two duty cycles in the presence of an external magnetic field in arbitrary units.

However, the AC zero-flux current sensor as depicted in FIG. 2 is still only capable of measuring the amperage of an alternating current (AC), as a current in the detection winding 2A can only be excited by a non-constant (over time) magnetic flux or, equivalently, magnetic field within the core 1. A further variant of a current sensor, for example, a closed-loop fluxgate current sensor, is therefore illustrated in FIGS. 3, 4A, 4B, 5A, and 5B, showing the basic principle of, for example, the DRV401-Q1™ fluxgate current sensor of Texas Instruments™ (FIG. 5A is taken from the specification of DRV401-Q1™ fluxgate current sensor of Texas Instruments™ and FIG. 5B is based on a figure taken from the specification of DRV401-Q1™ fluxgate current sensor of Texas Instruments™).

An excitation winding 2A' is wound as an inductor around a part of core 1. The excitation winding 2A' is connected to an excitation driver 12, together forming an excitation circuit 8. The excitation driver 12 causes the excitation circuit to oscillate, for example, in a frequency range between 250 kHz and 550 kHz. As the current rise rate $dI_{exc}/dT$ (i.e., current rise rate with respect to time T) of the current $I_{exc}$ flowing through the excitation winding 2A' is proportional to the excitation winding induction L, that is, $dI_{exc}/dT \alpha L$, the oscillation frequency is a function of the magnetic properties of the core 1 and the excitation winding 2A'. Without external magnetic influence, the core 1 is driven from a saturation -B through the high inductance range to a saturation +B and back again in a fully time-symmetric manner because of the inherent symmetry of the magnetic hysteresis, as shown in FIG. 4A (with arbitrary units; this figure is taken from the specification of DRV401-Q1™ fluxgate current sensor of Texas Instruments™). The saturation and thus the direction of magnetization of the core 1 is detected via the excitation driver 12, FIG. 4A (upper curve; with arbitrary units). The lower curve in FIG. 4B (with arbitrary units; this figure is based on a figure taken from the specification of DRV401-Q1™ fluxgate current sensor of Texas Instruments™) shows the phases (i.e. the direction of magnetization) during several duty cycles (one duty cycle including two phases corresponding to the direction of the magnetization), wherein the two phases are of equal length.

However, when the core material is pre-magnetized in one direction by the magnetic field H generated by the current $I_P$ to be measured, a long charge time or a short charge time with regard to the saturation may result. This is because the current through the excitation winding 2A' generates a field $H_{osc}$ and a corresponding magnetic flux $\phi_{osc}$ that subtracts or adds to the magnetic flux $\phi$ generated in the core by the current $I_P$, driving the core 1 out of saturation or further into saturation, as shown in FIGS. 5A (hysteresis; arbitrary units) and 5B (upper curve: magnetization, lower curve: duty cycle; arbitrary units).

Thus, the magnetic flux $\phi$ generated by the current $I_P$ to be measured and hence the current $I_P$ itself are related to the ratio of the length of the charge time from saturation −B of the core 1 to saturation +B to the length charge time from saturation +B to saturation −B. When the magnetic flux $\phi$ equals zero, both charge times are equal.

These principles may now be combined with the principle of an AC zero-flux current sensor as described above with reference to FIG. 2 to achieve the features of a closed-loop current sensor. To that end, a compensation winding 2B is wound additionally around the core 1. The compensation winding 2B is driven by a compensation driver providing a driving current for the compensation winding 2B. The compensation driver takes a signal from the excitation driver corresponding to the current flowing in the excitation winding 2A' and feeds the signal via an integrator filter 13 and an H-bridge driver 14 into the compensation winding 2B, thus providing a negative feedback operation similar to that described in the context of the AC zero-flux current sensor.

The magnetic field H induced from the current $I_P$ to be measured in the conductor 5 is compensated by a current flowing through the compensation winding 2B. The excitation winding 2A', located at one part of the core 1, detects the magnetic flux within the core 1. This excitation winding 2A' delivers the signal to the amplifier (including the excitation driver 12, the integrator filter 13, and the H-bridge driver 14) that drives a compensation current through the compensation winding 2B, bringing the magnetic flux back to zero. The voltage of the compensation current, which can be measured between the terminals of a shunt resistor 11, is proportional to the current $I_P$ to be measured. The circuit according to FIG. 3 allows for current measurements over wide frequency ranges, including direct current (DC), and thus proves suitable for measuring the currents typically generated by batteries. These types of devices offer a contact-free measurement method, as well as excellent galvanic isolation performance combined with high resolution, accuracy, and reliability of measurement.

Integration of Current Sensors into a PCB

Each of the above-described current sensors includes at least one winding or coil (e.g., formed of a wire) and a core (e.g., made of a soft magnetic material). Windings can be integrated into a printed circuit board (PCB), for example, by using a PCB with different layers. A winding typically extends along a certain length (along a virtual longitudinal center axis, which is at the same time the center axis of the core) and includes several turns wound around the core. Each of the turns is a non-closed loop, that is, it has a first and a second end that are offset with respect to a chosen direction or orientation of the center axis. In some examples, the offset may be realized with respect to a direction perpendicular to the center axis. However, with respect to a given rotation direction (i.e., in a clockwise manner or counter-clockwise manner when viewed along said chosen direction/orientation of the longitudinal center axis), the second end of each turn is connected to the first end of the next turn (if any), thus forming a winding. The first end of the first turn and the second end of the last turn form the terminals of the winding. The length of the wire the winding is made of can be longer than the sum of the lengths of all turns, resulting in loose ends leading away from the winding to facilitate the connection of the winding with other electronic components.

In the following, different possibilities for implementing a winding (e.g., with or without a core) are described. For the sake of simplicity, the geometry of the windings is described with respect to a (virtual) straight line referred to as a longitudinal center axis. However, the functionality of the winding as an inductor is preserved when deforming the geometry of the winding by replacing the longitudinal (i.e., linear) center axis with a curved line. This would be the case, for example, when the core has a ring-shaped form with curved parts and the winding is wound around a part of the ring-shaped core.

One way of integrating a winding with a predefined number of N turns into a PCB having at least two layers is to implement the winding into the PCB such that its longitudinal center axis extends within the PCB; in other words, the center axis is parallel to the plane of the PCB. Here, the PCB includes two (neighboring) layers, at one of which, one half of each turn of the winding is realized (e.g., is located) as an essentially straight line (e.g., a substantially straight line), and at the other layer, the other half of each turn is realized (e.g., is located) likewise as an essentially straight line (e.g., a substantially straight line). Thus, each of the two neighboring layers includes N lines printed in parallel. The lines are of equal length and are arranged at the layers such that that they extend in directions perpendicular to the center axis. The lines at one of the layers may be arranged such that they are offset from (e.g., separated from) the lines at the other layer with respect to the chosen direction/orientation of the center axis. In other words, the lines at one of the layers may be arranged such that they are offset from the lines at the other layer in the chosen direction of the center axis. Each line has a first end and a second end. Except for the first line and the last line (with respect to the chosen direction/orientation of the center axis), each line, being realized at one of the two neighboring layers, is connected by its ends to two different lines at the other layer, the latter lines being arranged neighboring each other at the other layer, such that each pair of a line on one layer and a neighboring (with respect to said direction/orientation of the center axis) line at the other layer forms a turn, and the entirety of these turns forms one winding being realized at the two neighboring layers. In other words, the winding is assembled of two parts: One part, including one half of each turn, is arranged on one layer, the other part, including the other half of each turn, is arranged at a neighboring layer. Thus, the winding extends with its center axis in parallel with the plane of the PCB.

A core (or a part of a core) of a flat shape may be arranged between the above-described two neighboring layers of the PCB along the center axis such that the winding formed of the turns as described above winds around the core (or a part of the core). The core may have a bore or through-hole suitable for passing a conductor, for example, a busbar, thought the core, the conductor being electrically isolated from the material of the core.

A second way of integrating a winding into a PCB is to use a PCB having a plurality of parallel layers, wherein on each of the layers, or at least on each layer of a subset of the layers of the PCB, is formed one turn. The turns are formed around a (virtual) longitudinal center axis that is perpendicular to the layers and may be of essentially equal shape and equal size (e.g., substantially the same shape and size). Each turn has a first end and a second end with respect to a given rotation direction (i.e., in a clockwise manner or a counter-clockwise manner when viewed in a predefined direction/orientation along the longitudinal center axis). Except for the first turn and the last turn (with respect to said direction of the center axis), each turn is connected by its first end to the second end of the next (with respect to said direction of the center axis) turn and by its second end to the first end of the foregoing (with respect to said direction of the center axis) turn. This way, the entirety of the turns forms a winding that extends with its center axis perpendicular to the plane of the PCB. The first end of the first turn and the second end of the last turn form the terminals of the winding.

Along the center axis of the winding, a core (or a part of a core) can be realized in that a hole is arranged in the PCB (i.e., a hole is formed that traverses all the layers of the PCB) and the core is passed through these holes. The core itself may have a bore or through-hole suitable for passing a conductor through the core.

Figure 6:
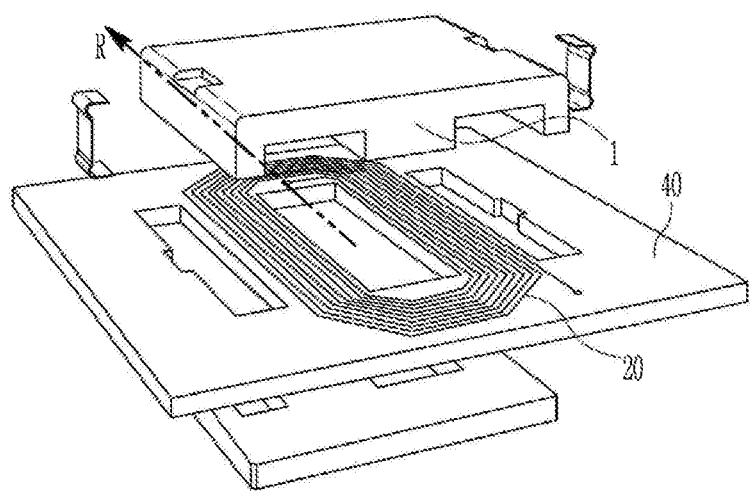
FIG. 6 shows schematically a perspective view of a planar winding (e.g., a flat spiral winding) wound around a core according to one example embodiment of the present invention.

A third way of integrating a winding with a PCB can be realized, which uses only a single layer of the PCB (e.g., see FIG. 6). To that end, a number of turns are printed onto the layer starting with an innermost turn, wherein for any turn (except for an outermost turn), a following turn is printed around this turn. Thus, each turn is wound around a (virtual) center axis being perpendicular to the plane of (the layer 40 of) the PCB. One direction R being parallel to the plane of the PCB and perpendicular to the center axis is defined starting at the intersection point of the center axis with the plane of the layer 40 and then leading radially outwards through the starting point (first end) of the innermost turn. Here, for each turn, a first end can be defined at the intersection of this turn with R. The turn is then led, at the layer of the PCB, around the center axis such that it intersects R a second time at a point defined as second end of the turn (possibly except for the outermost turn, for which the second end needs not necessarily be located on R). The second end of the turn is offset to the first end of the turn such that the distance of the second end to the center axis is larger than the distance of the first end of that turn to the center axis. For each turn, except for the outermost turn, the second end is connected to the first end of the following turn. Thus, the entirety of the turns forms a winding 20 that extends with its turns in parallel with the plane of the PCB and that has a center axis perpendicular to the PCB. The first end of the innermost turn and the second end of the outermost turn are the terminals of the winding 20. In other words, the winding 20 has the shape of a flat spiral that extends at the layer 40 of the PCB. Throughout the following, the winding 20 is therefore referred to as a "flat spiral winding."

Along the center axis of the winding, a core 1 (or a part of a core) can be realized in that one or more holes are arranged in the PCB (i.e., each of the one or more holes traverses the layers of the PCB) and the core 1 is passed through these holes. The core itself may have a bore or through-hole suitable for passing a conductor through the core.

The second way and the third way of integrating a winding with a PCB can be combined, provided that the PCB includes a plurality of stacked layers. To that end, at all or at least at several of these layers, a flat spiral winding is formed as described above around a joint (virtual) center axis perpendicular to the (layers of the) PCB. There may be two possibilities of how a flat spiral winding can be realized at a layer: when a current flows from the inner terminal of the flat spiral winding to its outer terminal, the current may flow (i) in a positive or (ii) in a negative rotational direction with respect to a chosen direction/orientation of the center axis. In case (i), the flat spiral winding shall be referred to as having a positive orientation, whereas in case (ii), the flat spiral winding shall be referred to as having a negative orientation, throughout the following. Here, for any one of the flat spiral windings with a positive orientation, the inner terminal is referred to as its first end, and the outer terminal is referred to as its second end throughout the following. For any one of the flat spiral windings with negative orientation, the outer terminal is referred to as its first end, and the inner terminal is referred to as its second end throughout the following.

A complete winding that includes the turns of any of the flat spiral windings can be obtained as follows: For each of the flat spiral windings, except for the last flat spiral winding (with respect to said chosen direction/orientation of the center axis), its second end is connected to the first end of the next (with respect to said chosen direction/orientation of the center axis) flat spiral winding. The first end of the first flat spiral winding and the second end of the last flat spiral winding are the terminals of the complete winding. For example, for each of the flat spiral windings, except for the last flat spiral winding (with respect to said chosen direction/orientation of the center axis), its first end is connected to the second end of the next (with respect to said chosen direction/orientation of the center axis) flat spiral winding. The second end of the first flat spiral winding and the first end of the last flat spiral winding are the terminals of the complete winding. In both cases, the number of turns of the complete winding equals the sum of the numbers of the turns of the individual flat spiral windings included in the complete winding. Further, when a current flows through the complete winding, the current flows through each of its turns with a like rotational direction (with respect to said chosen direction/orientation of the center axis). In other words, when a current flows through the complete winding, the current flow through each of the constituent flat spiral windings has the same rotational direction.

Again, along the center axis of the winding, a core 1 could be realized in that one or more holes are arranged in the PCB (i.e., one or more holes traverse the layers of the PCB) and the core is passed through these holes. The core itself may have a bore or through-hole suitable for passing a conductor through the core.

As described in the foregoing section, a fluxgate current sensor is realized using a ring-shaped core and at least one excitation winding 2A' as well as at least one compensation winding 2B wound around said ring-shaped core. According to the invention, a fluxgate current sensor is integrated with the PCB of the BMU of a battery system, thus rendering a design, wherein the fluxgate current sensor requires an implementation separated from the BMU, no longer necessary.

Figure 7:
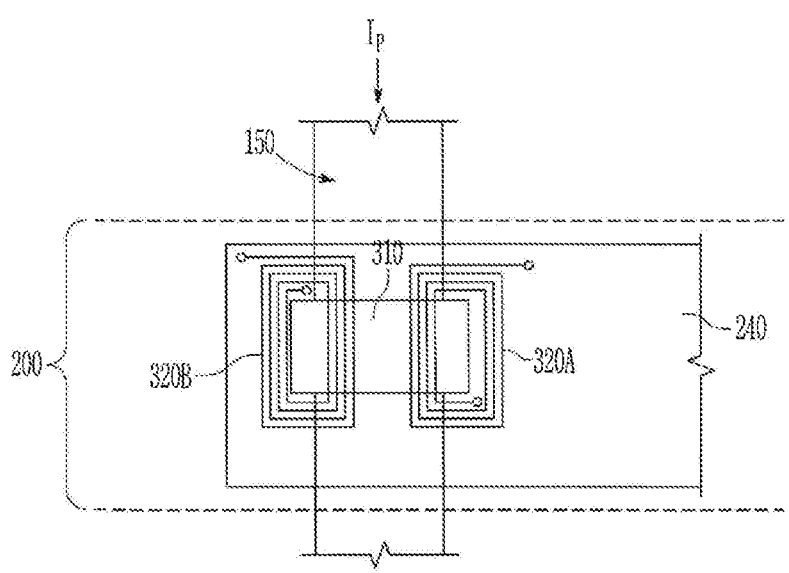
FIG. 7 is a planar cross-sectional view of a battery management system with a fluxgate current sensor according to one example embodiment of the present invention.

An embodiment of a BMU with a PCB having an integrated current sensor according to the invention is depicted in FIG. 7 (showing a schematic cross-sectional view from the top). Here, the current sensor is a closed-loop fluxgate current sensor as described above with reference to FIGS. 3, 4A, 4B, 5A, and 5B. The BMU 200 includes a PCB 240. The PCB 240 includes one or more layers. The PCB has two holes through which a ring-shaped core 310, made of a material having a high magnetic permeability such as iron or a soft ferrite, is passed. The core 310 may have a rectangular shape with a likewise rectangular through-hole 310' similar to the embodiment illustrated in FIG. 8.

At one of the layers, an excitation winding 320 A is realized in the manner similar to that described above with respect to the third way of integrating a winding with a PCB and as illustrated in FIG. 6. The excitation winding 320 A is printed on the layer around one of the holes through which the core 310 is passed. The terminals of the excitation winding 320 A are connected with the excitation driver 12 of the sensor electronics (e.g., sensor circuit) 10 of the fluxgate current sensor as depicted in FIG. 3. The sensor electronics 10 is realized on the PCB 240 of the BMU 200.

At one of the layers, a compensation winding 320 B is realized. This layer is the same layer on which the excitation winding 320 A is realized when the PCB includes only one layer or, when the PCB includes several layers, may also be a different layer. The compensation winding 320 B is realized in a manner similar to that described above with reference to the third way of integrating a winding with a PCB and as illustrated in FIG. 6. The compensation winding 320 B is printed on the layer around one of the holes through which the core 310 is passed. The terminals of the compensation winding 320 B are connected with the terminals of the shunt resistor 11 of the sensor electronics 10 of the fluxgate current sensor.

Through the through-hole 310' of the core 310, a busbar 150 of a battery system 100 is passable. FIG. 7 shows the state in which the busbar 150 is passed through said through-hole 310'. When a current $I_P$ flows through the busbar 150, a magnetic field is generated around the busbar 150 that yields a magnetic flux in the core 310. This magnetic flux is then measurable using the techniques described above with reference to the fluxgate current sensor.

Figure 8:
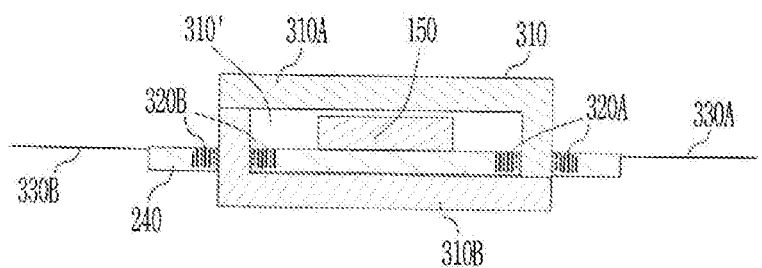
FIG. 8 shows a longitudinal section of a battery management system with a fluxgate current sensor according to one example embodiment of the present invention.

Another embodiment of a BMU with a PCB having an integrated current sensor according to the invention is depicted in FIG. 8 (showing a longitudinal section of the BMU with the PCB). This embodiment is similar to the previously described embodiment of FIG. 7 except for the feature that the PCB 240 includes a plurality of layers, and the excitation winding 320 A as well as the compensation winding 320 B are each realized at several layers (e.g., at 6 layers), in a manner similar to that described above with respect to the second way of integrating a winding with a PCB. The connection of the windings 320A and 320B to the sensor electronics 10 and their respective locations may be identical or substantially similar to the previously described embodiment.

The core 310 may have a rectangular shape with a likewise rectangular through-hole 310'. In particular, the core 310 may include two U-shaped parts 310A and 310B being configured such that the U-shaped parts 310A and 310B can be assembled so as to form the core 310. In case of a rectangular-shaped core 310, the edges of the "U" may be considered not as being rounded, but as edges having an angled (e.g., a right-angled) cross-section. Upon assembling the core 310, the arms of the U-shaped parts 310A and 310B can be passed through the holes in the PCB to facilitate the manufacturing of the BMU. In an embodiment, the two U-shaped parts 310A and 310B are held together when the core 1 is assembled by using at least two spring brackets 380A and 380B. In some examples, the two U-shaped parts may be held together by an adhesive and/or the BMU's housing.

Figure 9:
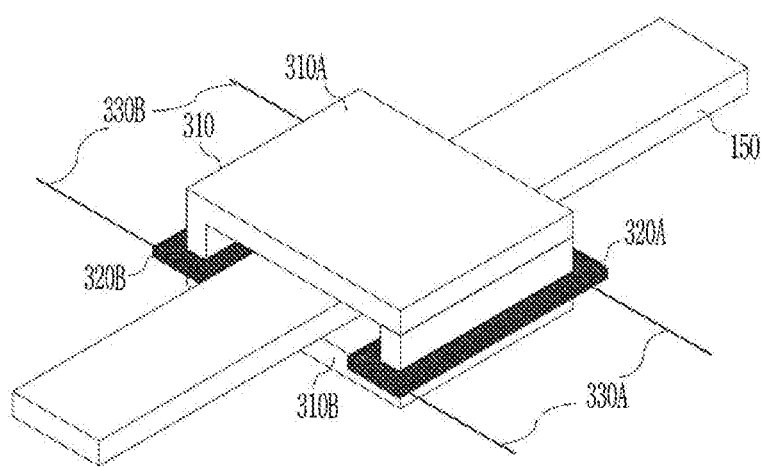
FIG. 9 is a schematic perspective view of a battery management system with a fluxgate current sensor according to one example embodiment of the present invention.

Still another embodiment of a BMU with a PCB having an integrated current sensor according to the invention realizes the implementation of the windings as described above as a combination of the second and third way of integrating a winding with a PCB with several layers, for example, six layers (see, e.g., FIG. 9). As a result, the number of turns of the windings can be increased in comparison to each of the afore-described embodiments, while at the same time maintaining a compact, space-saving design of the windings on the PCB. For the excitation winding 320 A as well as for the compensation winding 320 B, a flat spiral winding is realized on each layer of the PCB. A cross-sectional view of the design appears like the view of FIG. 7, and a longitudinal section appears like the view of FIG. 8. The sensor electronics and the connection of the windings with the sensor electronics is realized as in the afore-described embodiments.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art. Further, if the term "substantially" is used in combination with a feature that could be expressed using a numeric value, the term "substantially" denotes a range of ±5%.

As used herein, the terms "use," "using," and "used" may be considered synonymous with the terms "utilize," "utilizing," and "utilized," respectively.

The battery management unit and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the battery management unit may be formed on one integrated circuit (IC) chip or on separate IC chips. Further, the various components of the battery management unit may be implemented on a flexible printed circuit film, a tape carrier package (TCP), a printed circuit board (PCB), or formed on a same substrate. Further, the various components of the battery management unit may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

A person of skill in the art should recognize that the functionality of various computing devices may be combined or integrated into a single computing device, or the functionality of a particular computing device may be distributed across one or more other computing devices without departing from the scope of the present invention, which is defined by the following claims and equivalents thereof.

LISTING OF SOME OF THE REFERENCE SYMBOLS 1 magnetic core
2 secondary winding
2A detection winding
2A' excitation winding
2B compensation winding
5 conductor ("primary side")
8 excitation circuit
10 sensor electronics
11 shunt resistor
11A, B terminals of shunt resistor
12 excitation driver
13 integrator filter
14 H-bridge driver
15 operational (differential) amplifier
20 winding, printed on one layer of a PCB
40 layer of a PCB
150 busbar
200 battery management unit (BMU)
240 printed circuit board (PCB) of the BMU
310 magnetic core
310A upper part of magnetic core 310 ("upper" with respect to FIG. 8)
310B lower part of magnetic core 310 ("lower" with respect to FIG. 8)
310' through-hole through magnetic core
320A excitation winding
320B compensation winding
380A, B spring brackets

What is claimed is:

1. A battery management unit for a battery system with a conductor or a busbar, the battery management unit comprising:
   a printed circuit board; and
   a fluxgate current sensor comprising:
      a magnetic core having a through-hole;
      at least one excitation winding wound around the magnetic core;
      at least one compensation winding wound around the magnetic core; and
      a sensor circuit configured to measure a magnetization of the at least one excitation winding, to generate a driving signal for driving the at least one compensation winding such that a magnetic flux in the magnetic core is cancelled out by a current in the at least one compensation winding, to generate a current flowing through the at least one compensation winding according to the driving signal, and to generate an output signal corresponding to a magnitude of an electric current flowing through the through-hole of the magnetic core;
   wherein the magnetic core, the at least one excitation winding, the at least one compensation winding, and the sensor circuit are each integrated into the printed circuit board, turns of the at least one excitation winding and the at least one compensation winding being entirely parallel to the printed circuit board, and
   wherein the magnetic core is arranged on the printed circuit board such that the battery management unit is mountable into the battery system and such that the conductor or the busbar of the battery system passes through the through-hole of the magnetic core.

2. The battery management unit according to claim 1, wherein each of the excitation and compensation windings comprises a plurality of turns, each of the turns extending in parallel with the printed circuit board around a virtual center axis perpendicular to the printed circuit board.

3. The battery management unit according to claim 2,
   wherein the printed circuit board comprises a plurality of layers,
   wherein the layers extend in stacked planes parallel to each other,
   wherein, for each winding of the at least one excitation winding and the at least one compensation winding, at most one turn extends per layer of the layers, and
   wherein, for each winding of the at least one excitation winding and the at least one compensation winding, any two consecutive turns are connected to each other such that an entirety of the turns forms the winding.

4. The battery management unit according to claim 2, wherein, for each winding of the at least one excitation winding and the at least one compensation winding, the turns of the winding are arranged at one layer of the printed circuit board to form a flat spiral.

5. The battery management unit according to claim 2,
wherein the printed circuit board comprises a plurality of layers,
wherein the layers extend in stacked planes parallel to each other,
wherein each winding of the at least one excitation winding and the at least one compensation winding comprises flat spiral windings arranged at all or a subset of the layers, and
wherein, for each winding of the at least one excitation winding and the at least one compensation winding, any two neighboring flat spiral windings are connected to each other such that an entirety of the turns forms one winding.

6. The battery management unit according to claim 1, wherein the magnetic core is, apart from the through-hole, shaped as a cuboid.

7. The battery management unit according to claim 1, wherein the through-hole has a rectangular cross-sectional shape, a polygonal cross-sectional shape, an elliptical cross-sectional shape, or a circular cross-sectional shape.

8. The battery management unit according to claim 1, wherein the magnetic core passes through holes in the printed circuit board.

9. The battery management unit according to claim 8,
wherein a number of holes in the printed circuit board is two, and
wherein the magnetic core comprises two U-shaped parts being shaped to pass through the holes in the printed circuit board.

10. The battery management unit according to claim 9, wherein the two U-shaped parts of the magnetic core are configured to be held together by one or more spring brackets, by an adhesive, or by a housing of the battery management unit.

11. The battery management unit according to claim 1,
wherein the printed circuit board comprises two neighboring layers,
wherein the magnetic core is flat and located between the two neighboring layers,
wherein each of the two neighboring layers of the printed circuit board has a through-hole of a plurality of through-holes,
wherein the through-hole of the magnetic core and the through-holes of the two neighboring layers are located to accommodate a conductor or a busbar passing through any one of said through-holes along a virtual center axis perpendicular to the printed circuit board, and
wherein, for each one of the excitation and compensation windings, one half of each complete turn is arranged at one of the two neighboring layers and an other half of each complete turn is arranged on an other of the two neighboring layers.

12. The battery management unit according to claim 11, wherein the magnetic core has a rectangular shape, a square shape, an elliptical shape, or a circular shape.

13. The battery management unit according to claim 11, wherein each of the through-hole in the magnetic core and the through-holes in the two neighboring layers of the printed circuit board has a rectangular shape, a square shape, an elliptical shape, or a circular shape.

14. A battery system comprising:
the battery management unit according to claim 1; and
a conductor,
wherein the conductor is passed through the through-hole of the magnetic core.

* * * * *